(12) United States Patent
Gao et al.

(10) Patent No.: US 7,931,145 B2
(45) Date of Patent: Apr. 26, 2011

(54) CASSETTE AND HANDLING SYSTEM

(75) Inventors: Haoran Gao, Beijing (CN); Wei Shen, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 84 days.

(21) Appl. No.: 12/273,056

(22) Filed: Nov. 18, 2008

(65) Prior Publication Data

US 2009/0194659 A1 Aug. 6, 2009

(30) Foreign Application Priority Data

Feb. 4, 2008 (CN) .......................... 2008 1 0057690

(51) Int. Cl.
*B65D 85/48* (2006.01)
(52) U.S. Cl. ..... 206/454; 206/711; 211/41.1; 211/41.18
(58) Field of Classification Search .................. 206/454, 206/710, 711, 722, 724, 727, 821, 822; 211/41.1, 211/41.18

See application file for complete search history.

(56) References Cited

U.S. PATENT DOCUMENTS

| | | | | |
|---|---|---|---|---|
| 5,853,214 A | * | 12/1998 | Babbs et al. .................. | 294/161 |
| 5,890,597 A | * | 4/1999 | Fan et al. ...................... | 206/710 |
| 5,960,959 A | * | 10/1999 | Wu et al. ........................ | 206/710 |
| 2005/0041325 A1 | * | 2/2005 | Chuang et al. ................... | 360/92 |
| 2006/0060495 A1 | * | 3/2006 | Chen et al. ..................... | 206/711 |

* cited by examiner

*Primary Examiner* — J. Gregory Pickett
*Assistant Examiner* — Ernesto A Grano
(74) *Attorney, Agent, or Firm* — Ladas & Parry LLP

(57) ABSTRACT

An embodiment of the invention provides a cassette comprising a top plate, a base plate, a plurality of posts arranged between the top plate and the base plate and defining an operation space, a securing device comprising a stop mechanism and a clamping mechanism and arranged along with one post. The stop mechanism comprises a stop projection provided on an outer side of the one of posts, a stop bar parallel to the one post and slidable disposed through the stop projection, and a stop block disposed on a side of the stop bar. A lower end of the stop bar extends beyond a plane of the base plate when the stop block is bearing against an upper surface of the stop projection. The clamping mechanism comprises a first connection part with a rotation shaft in a middle portion of the first connection part being fixed to the one post and with one end connected with the stop bar in a transmission way, and a securing portion, which connects with the other end of the first connection part and is driven by the first connection part to move horizontally with respect to the one post when an up-and-down movement of the stop bar leads to rotation of the first connection part.

18 Claims, 5 Drawing Sheets

CASSETTE AND HANDLING SYSTEM

BACKGROUND

The present invention relates to a cassette and a handling system having the same.

Recently, liquid crystal displays (LCDs), especially thin film transistor liquid crystal displays (TFT-LCDs), as a kind of flat panel displays, are increasingly becoming popular. In a LCD, a color filter substrate and an array substrate which are assembled together are essential parts for manufacturing a LCD. Both of the substrates are made by using a thin glass plate as a base. During manufacturing a LCD, unprocessed glass plates, processed glass plates, or assembled panels are always needed to be carried to somewhere. Especially, during manufacturing an array substrate (thin film transistor substrate), there are a number of processes, which each involve some apparatuses of different functions, for example, a processing apparatus for processing the plates and carrying apparatus for loading and/or unloading the plates, and so on.

In a conventional method, a cassette is often used as an apparatus for storing and carrying glass plates. Such a cassette 100 is shown in FIG. 1, which comprises a top plate 101 and a base plate 102 with posts 103 arranged between the top plate 101 and the base plate 102. The posts 103 are arranged on three sides of the plates 101 and 102 so as to define a space for operation, leaving one side open for handling glass plates 200. Support beams 104 are arranged on the inner side of the posts 103 facing the inside of the cassette 100 and supporting the glass plate 200 thereon, and the support beams 104 may be a single beam connected between two opposite posts 103 or a short bar projected from the side of each post 103, respectively, as long as they can support the glass plate 200 thereon. In operation, the cassette 100 usually cooperates with a handling desk 300. The handling desk 300 comprises a base platform 301 for placing the cassette 100 and a recess for picking up and/or placing of the cassette 100 with an apparatus such as a forklift. The handling desk 300 is usually fixed to the ground beside the processing apparatus. After the cassette 100 is carried and placed on the handling desk 300, the glass plates 200 housed in the cassette 100 can be picked up and placed on the processing apparatus for further processing.

The cassette may be typically provided with a plurality of support beams at different levels, so that glass plates can be placed on the support beams at different levels and carried between various processing apparatuses simultaneously. That is, the glass plates housed in a same cassette can be carried and processed together until they become finished products after various steps, thus improving productivity. Therefore, during processing, storing and carrying, the several glass plates in the same cassette can be regarded as a whole.

However, during transporting or carrying, vibrations and unexpected shakes give rise to a degree of position offset for the glass plates. The position offset may accumulate among the processions so that the glass plates may go beyond the bounds of processing, bringing about mismachining tolerance. The cassette of the above design is designed only for the purpose of loading and unloading glass plates and can not adjust the position of the glass plates even if there is position offsets of the glass plates. In order to cope with the problem, a position adjustment device is provided for the glass plates in the processing apparatus and brings a limited position adjustment for the glass plates before processing. Generally, such position adjustment device is incorporated into a carrying robot, a carrying apparatus, or the processing apparatus as an additional apparatus such as a pusher or a clamper, intending to keep the position offsets of the glass plates within the bounds of processing.

In order to clearly show the position offsets of the glass plates during transporting, experiments have bee made. Table 1 shows a set of experiment data, which denotes the measured values of the position offset of the glass plates during three long distance transportations of the cassette.

TABLE 1

| Slot ID | A1 | A2 | A3 | B1 | B2 | B3 | C1 | C2 | C3 | D1 | D2 | D3 |
|---|---|---|---|---|---|---|---|---|---|---|---|---|
| 1 | 13.5 | 14 | 14.5 | 10 | 10.5 | 11.5 | 9 | 9.5 | 10.5 | 11.5 | 10.5 | 10 |
| 2 | 10 | 10.5 | 11.5 | 6.5 | 6.5 | 12 | 9.5 | 10 | 10.5 | 15 | 14.5 | 9 |
| 3 | 11 | 11.5 | 12 | 6.5 | 7 | 12 | 9.5 | 9 | 10 | 14.5 | 13.5 | 8.5 |
| 4 | 13 | 13 | 13.5 | 7 | 7.5 | 12.5 | 8 | 9 | 9.5 | 12.5 | 11.5 | 11 |
| 5 | 12.5 | 11 | 11.5 | 8 | 8.5 | 9.5 | 10 | 10.5 | 9.5 | 14.5 | 13.5 | 14 |
| 6 | 11.5 | 11.5 | 11 | 8 | 8.5 | 9.5 | 11.5 | 12 | 13.5 | 14.5 | 14 | 14.5 |
| 7 | 12 | 12.5 | 12.5 | 8 | 7.5 | 9 | 10.5 | 11 | 11.5 | 13.5 | 13 | 13 |
| 8 | 13 | 12.5 | 13 | 8 | 8.5 | 9 | 10.5 | 11 | 11.5 | 12.5 | 12.5 | 12 |
| 9 | 13 | 13 | 13 | 8.5 | 9 | 9.5 | 10 | 11 | 11 | 12 | 12 | 12 |
| 10 | 14 | 14 | 14 | 8 | 8.5 | 9.5 | 9.5 | 9.5 | 10.5 | 11.5 | 11 | 11 |
| 11 | 14 | 14 | 14 | 8.5 | 8.5 | 9 | 10 | 10.5 | 11 | 11.5 | 11.5 | 11 |
| 12 | 14 | 14 | 14 | 8.5 | 8.5 | 9 | 11 | 11 | 11.5 | 11.5 | 11.5 | 11.5 |
| 13 | 13 | 13 | 13.5 | 9 | 9 | 10 | 11.5 | 11.5 | 12 | 12 | 11.5 | 12 |
| 14 | 13.5 | 13 | 13 | 8 | 8 | 8.5 | 10 | 10.5 | 11 | 11.5 | 12 | 12 |
| 15 | 14 | 13.5 | 14 | 8.5 | 9 | 8.5 | 10.5 | 10.5 | 11 | 11 | 11 | 11 |
| 16 | 13 | 13 | 12.5 | 7.5 | 7.5 | 7.5 | 10.5 | 11 | 11 | 11.5 | 12 | 12 |
| 17 | 14 | 13.5 | 13.5 | 8 | 8.5 | 8.5 | 9.5 | 10 | 11 | 11.5 | 11 | 10.5 |
| 18 | 14 | 14 | 14 | 8 | 8.5 | 8.5 | 11 | 10 | 12.5 | 11.5 | 10.5 | 10 |
| 19 | 14 | 14 | 13.5 | 7 | 8.5 | 8 | 8.5 | 9.5 | 10.5 | 11 | 10.5 | 10.5 |
| 20 | 14.5 | 14 | 14.5 | 7 | 8 | 8.5 | 9.5 | 9.5 | 9.5 | 10.5 | 10.5 | 9.5 |

In Table 1, entries A, B, C and D represent the measured values of the distance between the edge of the glass plates 200 and the edge of the cassette 100 at $L_A$, $L_B$, $L_C$, and $L_D$, respectively, as shown in FIG. 2, and the numbers following A, B, C and D represent the times of transportation, respectively; the sequence numbers in the column correspond to the glass plates in the cassette, and the less the number, the lower the corresponding glass plate is positioned in the cassette.

The above table records the accumulated position offsets at the four measuring sites for each of the twenty glass plates carried in the cassette. The unit of the position offset in the table is millimeter (mm). The table shows that the glass plates tend to shift to the outside of the cassette, and the glass plates at different levels have different position offsets. Furthermore, the table shows a phenomenon that some glass plate may experience a relative bigger "jump" after a certain transportation, which makes the glass plate shift outside of the position adjustment capability of the processing apparatus and accordingly may result in an industrial accident.

Thus, it needed to reduce the position offsets during the transportation of the glass plates, especially, in manufacturing a LCD.

SUMMARY

An embodiment of the invention provides a cassette comprising a top plate, a base plate, a plurality of posts arranged between the top plate and the base plate and defining an operation space, a securing device comprising a stop mechanism and a clamping mechanism and arranged along with one post. The stop mechanism comprises a stop projection provided on an outer side of the one of posts, a stop bar parallel to the one post and slidable disposed through the stop projection, and a stop block disposed on a side of the stop bar. A lower end of the stop bar extends beyond a plane of the base plate when the stop block is bearing against an upper surface of the stop projection. The clamping mechanism comprises a first connection part with a rotation shaft in a middle portion of the first connection part being fixed to the one post and with one end connected with the stop bar in a transmission way, and a securing portion, which connects with the other end of the first connection part and is driven by the first connection part to move horizontally with respect to the one post when an up-and-down movement of the stop bar leads to rotation of the first connection part.

Another embodiment of the invention provides a handling system comprising a cassette and a handling desk for supporting the cassette thereon. The cassette comprises a top plate, a base plate, a plurality of posts arranged between the top plate and the base plate and defining an operation space, and a securing device comprising a stop mechanism and a clamping mechanism and arranged along with one post. The stop mechanism comprises a stop projection provided on an outer side of the one of posts, a stop bar parallel to the one post and slidable disposed through the stop projection, a stop block disposed on a side of the stop bar. A lower end of the stop bar extends beyond a plane of the base plate when the stop block is bearing against an upper surface of the stop projection. The clamping mechanism comprises a first connection part with a rotation shaft in a middle portion of the first connection part being fixed to the one post and with one end connected with the stop bar in a transmission way, and a securing portion, which connects with the other end of the first connection part and is driven by the first connection part to move horizontally with respect to the one post when an up-and-down movement of the stop bar leads to rotation of the first connection part.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

First Embodiment of Cassette

Figure 1:
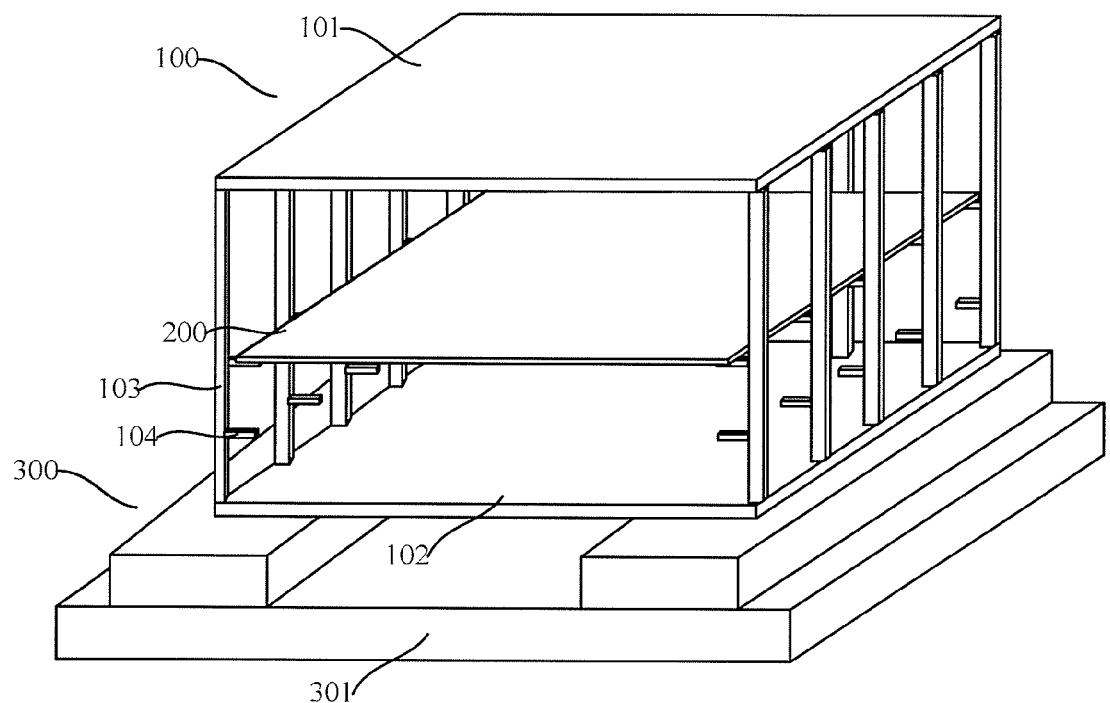
FIG. 1 is an illustrative view of a structure of a conventional cassette.
Figure 2:
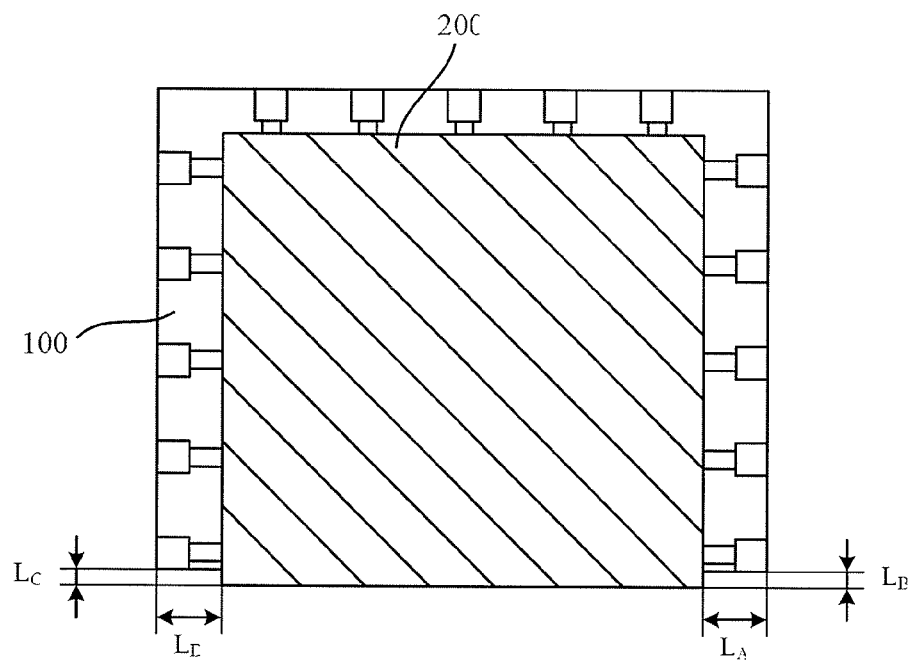
FIG. 2 is an illustrative view showing measuring sites of the glass plate in the experiment.
Figure 3:
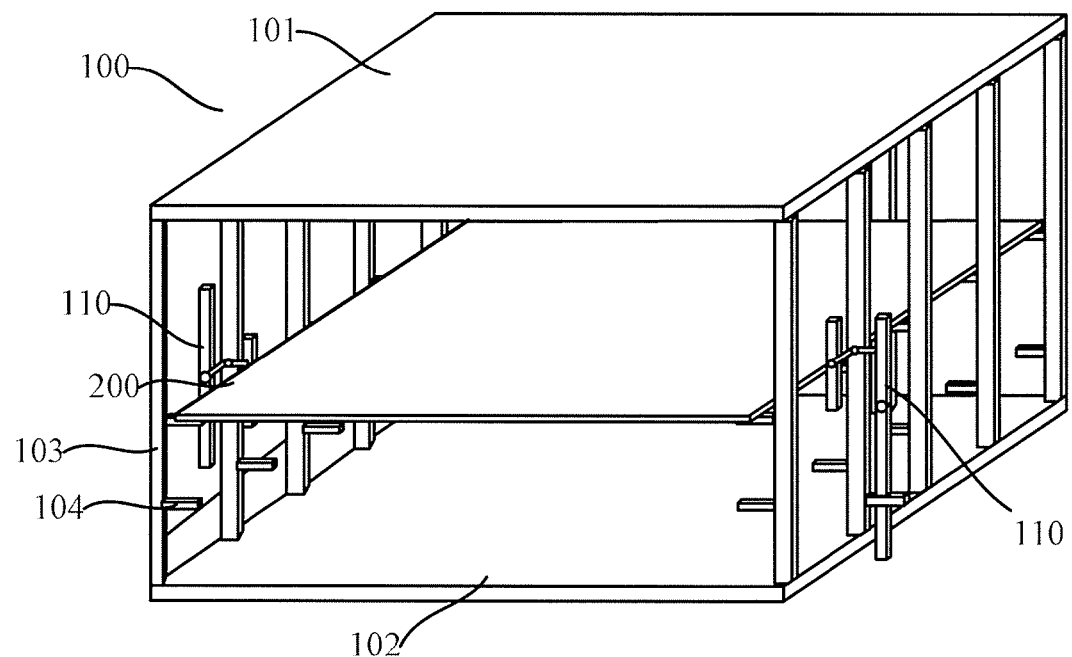
FIG. 3 is an illustrative view of a structure of a first embodiment of a cassette according to the present invention.

FIG. 3 is an illustrative view of a structure of a first embodiment of a cassette according to the present invention. The cassette 100 comprises a top plate 1001 and a base plate 102 with a plurality of posts 103 arranged between the top plate 101 and the base plate 102. The posts 103 are arranged on three sides of the plates 101 and 102 so as to define a space for operation, leaving one side open for handling a glass plate 200. A plurality of support beams 104 are arranged on the inner side of the posts 103 facing the inside of the cassette 100 and supporting the glass plate 200 thereon, and the support beams 104 may be a single beam connected between two opposite posts 103 or a short bar projected from the side of each post 103, respectively, as long as they can support the glass plate 200 thereon. The cassette 100 is further provided with two securing devices 110, which are arranged along with respective posts 103 on two opposite sides of the cassette 100.

Figure 4:
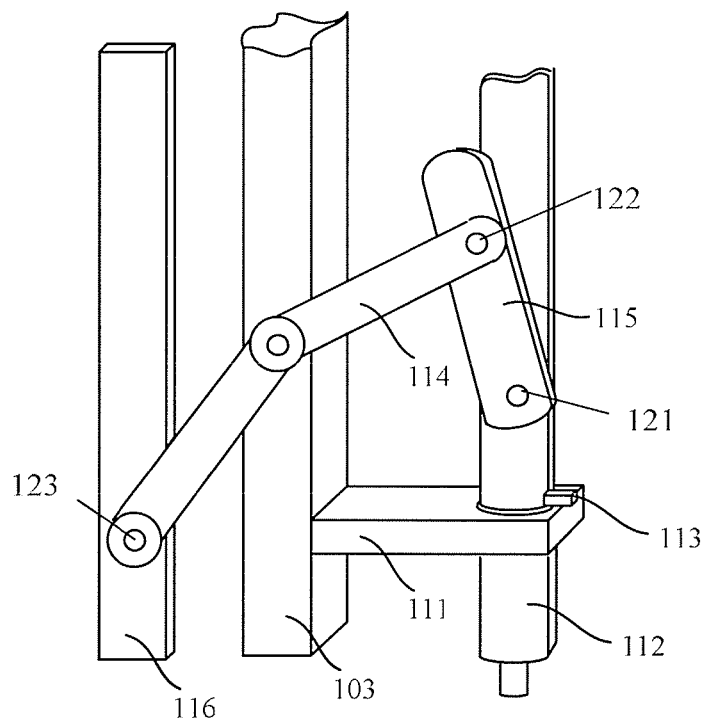
FIG. 4 is an illustrative view of a structure of a securing device in the first embodiment of the cassette according to the present invention.

Each securing device 110 is provided along with one post 103 and comprises a stop mechanism and a clamping mechanism as shown in detail in FIG. 4. Specifically, the stop mechanism comprises a stop projection 111 provided on an outer side of the post 103 and having a vertical through hole, a stop bar 112 parallel to the post 103 and slidable disposed in the vertical through hole so that the stop bar 112 can move up and down with respect to the stop projection 111 (that is, the post 103) in the through hole, and a stop block 113 disposed on a side of the stop bar 112 and over the through hole. The size of the stop bar matches that of the through hole, and the stop block 113 extends beyond the size of the through hole and can be pressed against the upper surface of the stop projection 111 so as to limit the downward movement of the stop bar 112 but not limit upward movement of the stop bar 112. Therefore, the lower end of the stop bar 112 can extend beyond the plane of the base plate when the stop block 113 is pressed against the upper surface of the stop projection 111, and the lower end of the stop bar 112 extending beyond the plane of the base plate can act as a sensing probe. The clamping mechanism comprises a first link lever 114, a second link lever 115, and a securing portion. The first link lever 114, that is, a first connection part, has a rotation shaft in a middle portion thereof that is fixed to a side of the post 103. An end of the first link lever 114 facing the outside of cassette is connected with the stop bar 112 in a transmission way, and in this embodiment, the end of the first link lever 114 is connected with the stop bar 112 via the second link lever 115, namely a second connection part. The lower end of the second link lever 115 is hinged with the stop bar 112 with a first hinge 121, and the middle portion of the second link lever 115 is hinged with the outer end of first link lever 114 with a second hinge 122 so that the first and second link levers 114, 115 are able to rotate with respect to each other. The securing portion 116 is hinged with the other end of the first link lever 114 facing the inside of the cassette 100 with a third hinge 123. The first link lever 114 drives the securing portion 116 to move horizontally with respect to the post 103, and the up-and-down movement of the stop bar 112 in turn leads to rotation of the first link lever 114. The hinge connections between the above parts have shafts parallel with each other, and thus the parts can rotate in a same plane.

In operation, the securing device of the embodiment can perform two actions, i.e., a releasing action and a clamping action, which are introduced below, respectively.

The releasing action can be realized in the following case. The cassette 100 is placed on a plane such as a handling desk or the ground, and at that time, the lower end of the stop bar 112 is located on a same plane as the base plate 102, so that the stop block 113 does not bear against the upper surface of the stop projection 111; at the same time, the upward movement of the stop bar 112 leads to an upward movement of the first hinge 121 between the second link lever 115 and the stop bar 112, the second link lever 115 then brings the second hinge between the first and second link lever 114, 115 to move upward and thus to rotate. Since the rotation shaft in the middle portion of the first link lever 114 are immovable, the upward movement of one end of the first link lever 114 causes rotation of the first link lever 114 about the shaft and the other end thereof goes downward with respect to the post 103. The securing portion 116 moves horizontally with respect to the post 103, that is, approaches the post 103, due to the drop of the inner end of the first link lever 114. After such position adjustment of each securing device 110, the distance between the two securing device that are facing each other increases, in other words, the cassette 100 is in a releasing state and is ready for housing glass plates 200 therein.

After glass plates 200 is placed into the cassette 100, and when the cassette 100 is carried by an apparatus such as a forklift and thus is lift from the plane, the clamping action begins to work. After the cassette is lift up, the stop bar 112 drops by gravity since the lower end of the stop bar 112 is free, and the stop bar 112 drops until the stop block 113 bears against the upper surface of the stop projection 111. Also, when the stop bar 112 drops, the second link lever 115, first link lever 114, and the securing portion 116 act in a way opposite to that in the releasing action when the stop bar 112 goes up, and therefore, the securing portion 116 moves horizontally away from the post 103, the distance between the two securing device facing each other decreases, in other words, the cassette 100 shifts to a clamping state, clamping the glass plate 200 therein.

The lower end of the stop bar 112 bears against a platform when the cassette 100 is paced on the platform after the cassette 100 is carried to a predetermined position, and at this time, the cassette 100 performs the release action again so as to release the glass plates 200 therein for picking up.

In the embodiment, positions of the hinges between the parts are not limited to an end or middle portion as those mentioned above but may be anywhere as long as the hinges enable the elements to rotate in a same plane. The position relationship between stop mechanism and clamping mechanism has no influence on their functions.

The cassette of present embodiment can clamp and fix the glass plates in place with simple structure and thus prevent position offsets of the glass plates with the securing device during transportation. Furthermore, the securing device can automatically release the glass plates for loading and unloading when the cassette is placed on the platform. Thus, this embodiment prevents the position offset of the glass plate with simple structure, low cost for reconstruction, and automatic operation of releasing and clamping actions of high reliability.

Second Embodiment of Cassette

Figure 5:
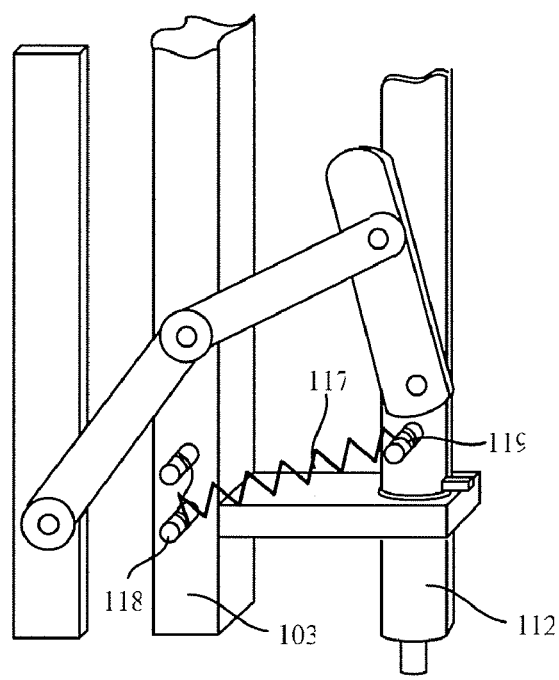
FIG. 5 is an illustrative view of a structure of a securing device in a second embodiment of the cassette according to the present invention.

FIG. 5 is an illustrative view of a structure of a securing device in a second embodiment of the cassette according to the present invention. The second embodiment is modified based on the first embodiment. A first spring positioning pillar 118 is disposed on a side of the post 103; a second spring positioning pillar 119 is disposed on a side of the stop bar 112 above the first spring positioning pillar 118; a spring 117 is also provided with two ends thereof being attached to the first spring positioning pillar 118 and the second spring positioning pillar 119, respectively.

In the first embodiment, the stop bar drops by gravity. However, in the transportation, the shock of the glass plates applies a force on the securing portion which may in turn pulls the stop bar up when the force is transmitted to the stop bar. The spring 117 of the present embodiment which is incorporated in on the basis of the first embodiment can resist the force and thus ensure the stop bar in a lowest position to clamp the glass plates in place during transportation.

The connection of the spring 117 between the post 103 and the stop bar 112 in the second embodiment is not limitative, which may be any form as long as only it enables the spring to pull down the stop bar 112 until the stop block 113 bears against the upper surface of the stop projection 111.

Third Embodiment of Cassette

Figure 6:
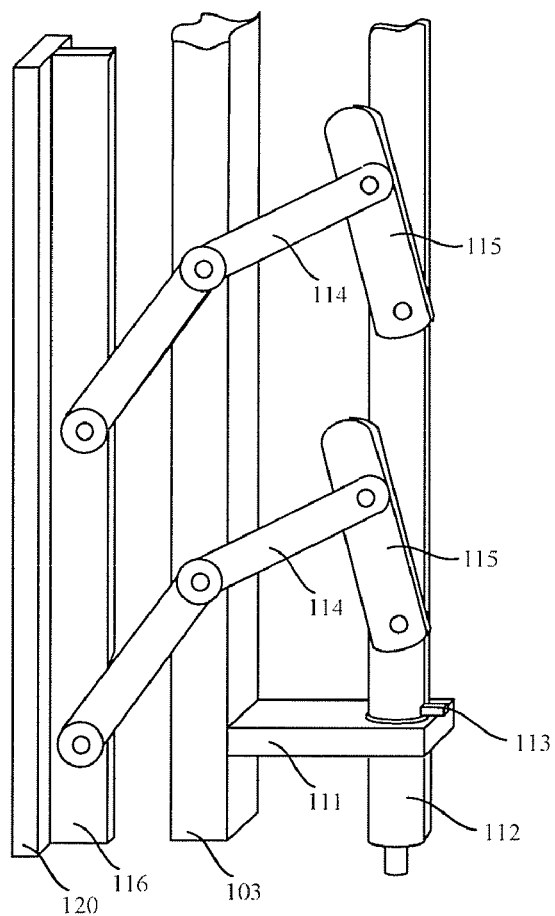
FIG. 6 is an illustrative view of a structure of a securing device in a third embodiment of the cassette according to the present invention.

FIG. 6 is an illustrative view of a structure of a securing device in a third embodiment of the cassette according to the present invention. The third embodiment differs from the first embodiment in that there are several clamping mechanisms provided between the post 103 and a corresponding stop bar 102, the securing portions 116 of which is integral (the same one) and thus forms a integrated securing post, and a first elastic pad 120, which may be sponge or rubber, for preventing wear to the glass plates 200 caused by direct contact of the securing portion 116 and for reducing compact due to the shock of the glass plates 200, is provided and connected to the inner side of the securing portion 116 facing the inside of the cassette 100.

In the embodiment, the securing portion is an integrated securing post, which can clamp the glass plates in the cassette in place at the same time. Alternatively, the securing portions of the securing device may be independent to each other, each for holding one corresponding glass plate. If the glass plates in the cassette are of different sizes, it is also possible to set the lengths of the portions of the first link levers between the securing portions and the posts to different sizes respectively to fit with the sizes of different glass plate.

The securing device of the cassette according to preset invention may be provided along with the posts at only one side of the cassette and cooperate with the posts at another side (opposite side) of the cassette to actively clamp the glass plates form one direction. Alternatively, the securing devices can be provided along with the posts at the opposite sides of the cassette and clamp the glass plates form both the opposite directions. One securing device may be provided along with one post at one side of the cassette; alternatively, more than one securing device may be provided along with more than one respective post. Further more than one securing device may be provided along with one post. The position and the amount of the securing device as necessary. The securing device may be made of a metal or a plastic material, as long as it can meet the strength required to clamp the glass plates.

In the embodiment of the cassette according to the present invention, the connection between the first link lever and the stop bar is not limited to the form as shown in FIG. 4, and there may be various alternatives. For example, the shaft of the first link lever may be parallel to the post, in which case the rotation of the first link lever can still move the securing portion close to or away form the post, while the first link lever and the stop bar are arranged in such a way that the up and down movement of the stop bar can be transformed into the rotation of the first conductive level. For example, the up and down movement can be transformed into the rotation of the rotation shaft of the first link lever via a threaded spindle, thus realizing the horizontal movement of the securing portion with respect to the post.

First Embodiment of Handling System

Figure 7:
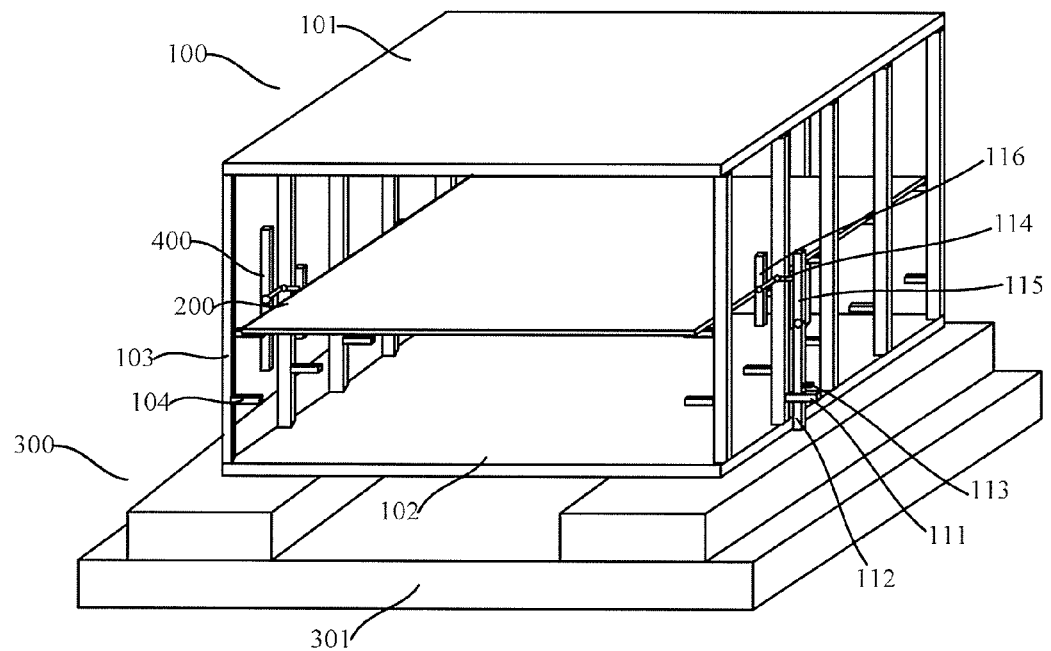
FIG. 7 is an illustrative view of a structure of a first embodiment of a handling system according to the present invention.

FIG. 7 is an illustrative view of a structure of a first embodiment of a handling system according to the present invention. The handling system comprises a handling desk 300 and a cassette 100 that may be one of the exemplary cassettes mentioned above. The handling system, also referred to as a cassette indexer, comprises a base platform 301 for supporting the cassette thereon. The cassette 100 comprises a top plate 101 and a base plate 102 with a plurality of posts 103 arranged between the top plate 101 and the base plate 102 and defining a space for operation. The cassette 100 is also provided with at least one securing device, which comprises a stop mechanism and a clamping mechanism. Specifically, the stop mechanism comprises a stop projection 111 provided on a side of the post 103 facing outside, a stop bar 112 parallel to the post 103 and slidable disposed in a through hole of the stop projection 111, and a stop block 113 disposed on a side of the stop bar 112. The lower end of the stop bar 112 extends beyond the plane of the base plate when the stop block 113 is bearing against the upper surface of the stop projection 111. The clamping mechanism comprises a first link lever 114, a second link lever 5, and a securing portion. The first link lever 114 has a rotation shaft in a middle portion thereof that is fixed to a side of the post 103. An end of the first link lever 114 facing the outside of cassette is connected with the stop bar 112 in a transmission way, and the end of the first link lever 114 is connected with the stop bar 112 via the second link lever 115, namely a second connection part. The lower end of the second link lever 115 is hinged with the stop bar 112 with a first hinge, and the middle portion of the second link lever is hinged with the outer end of first link lever 114 with a second hinge so that the first and second link levers 114, 115 are able to rotate with respect to each other. The securing portion 116 is hinged with the other end of the first link lever 114 facing the inside of the cassette 100 with a third hinge. The first link lever 114 drives the securing portion 116 to move horizontally with respect to the post 103, and the up-and-down movement of the stop bar 112 in turn leads to rotation of the first link lever 114.

The cassette in the present embodiment of the handling system can act as above described along with the first embodiment of the cassette, and the handling system can comprise a handling desk with a base platform for supporting the cassette thereon and cooperating with the cassette.

The handling system of present embodiment can clamp and fix the glass plates in place with simple structure and thus prevent position offsets of the glass plates with the securing device of the cassette during transportation. Furthermore, the securing device can automatically release the glass plates for loading and unloading when the cassette is placed on the platform. Thus, this embodiment prevents the position offset of the glass plate with simple structure, low cost for reconstruction, and automatic operation of releasing and clamping actions of high reliability.

The cassette of the handling system according this embodiment may be any one embodiments of the cassette described above. Specifically, the securing device of the cassette comprises the first connection part with one end connected to the stop bar via a second connection part, which hinges to the stop bar and the first connection part, respectively, and the other end that hinges with the securing portion, and the rotation shaft and the shafts of all the hinges are parallel to each other.

Further, a spring may connect the post and the stop bar, which can pull down the stop bar until the stop block bears against the upper surface of the stop projection. There may be more than one clamping mechanism connected to each post 103 and a corresponding stop bar 102, the securing portions of which is integral and thus forms an integrated securing post. Lengths of the first link levers connected between the securing portions and the posts may be in different sizes as necessary. The amount of the securing device can be determined as necessary. At least one securing device may be connected to at least one post on two opposite sides of the cassette. Furthermore, a first elastic pad may be further provided and connected to the inner side of the securing portion facing the inside of the cassette. The securing device may be made in metal or plastic materials.

Second Embodiment of Handling System

Figure 8:
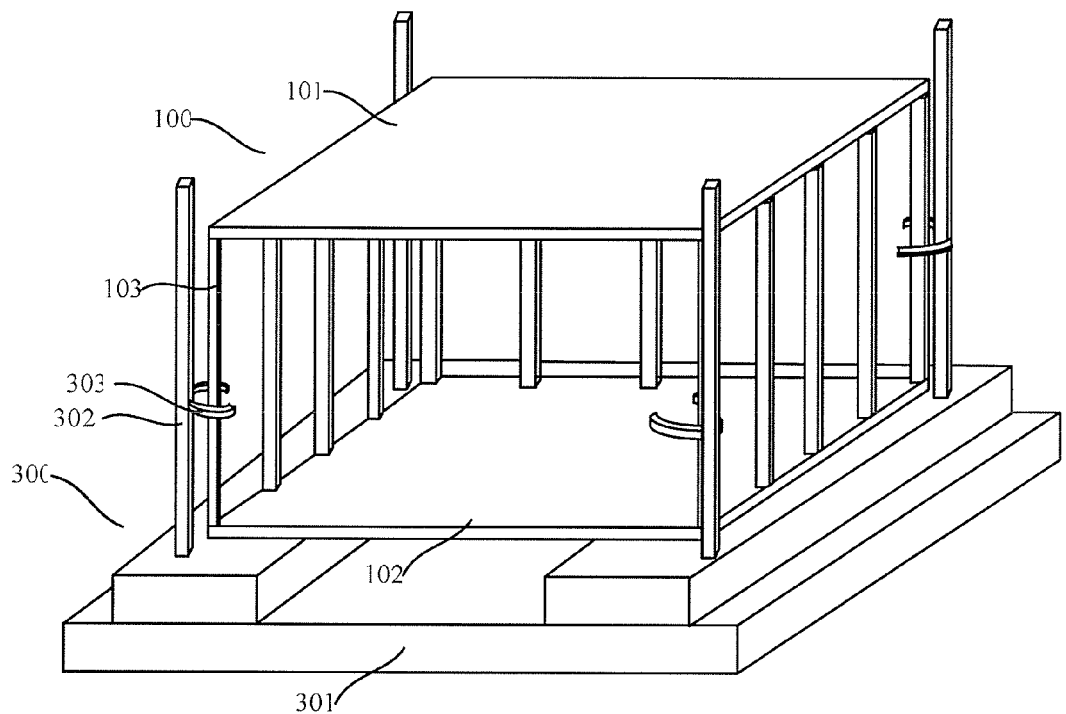
FIG. 8 is an illustrative view of a structure of a second embodiment of the handling system according to the present invention.
Figure 9:
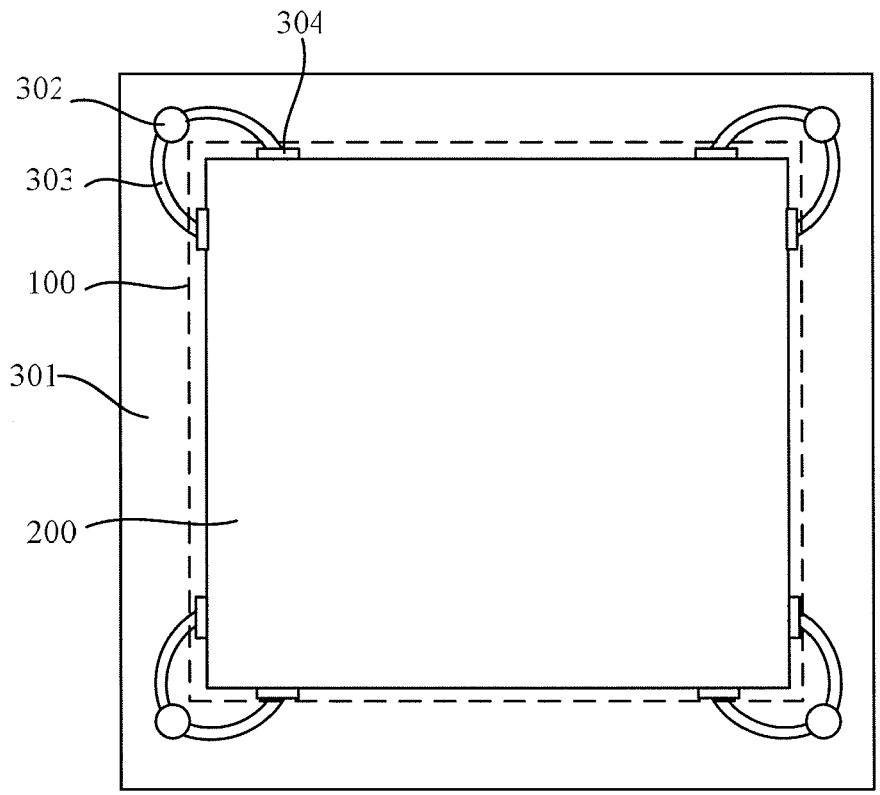
FIG. 9 is an illustrative view of a state of the second embodiment of the handling system according to the present invention, with the rotational arm in a closed position.

FIG. 8 is an illustrative view of a structure of a second embodiment of the handling system according to the present invention. The handling desk 300 of the handling system comprises a base platform 301, four positioning levers 302 vertically arranged on the base platform 301 at four corners for defining a region for placing the cassette on the base platform 301. That is, the cassette 100 (details of which is not shown in FIG. 8) is placed among the four positioning levers 302. At least one pair of rotational arms 303 are provided on each of the positioning levers 302. Each rotational arm is an arcuate lever, and each pair of rotational arms are oppositely arranged and can cooperate with each other to close and open when rotating about the positioning lever 302 in a same horizontal plane. In such a way, ends of each pair of the rotational arms 303 cooperate with each other to clamp the glass plates 200 placed in the cassette 100. FIG. 9 is an illustrative view of a state of the second embodiment of the handling system according to the present invention with the rotational arm in a closed state. A second elastic pad 304 that is made in sponge or rubber for preventing wear to the glass plates 200 is provided on the end of each rotational arm 303. Further, each pair of rotational arms 303 are further coupled to a control means (not shown) for controlling the aspects of rotation of the rotational arms 303, including torque, velocity and/or angle of the rotational arms 303.

Figure 10:
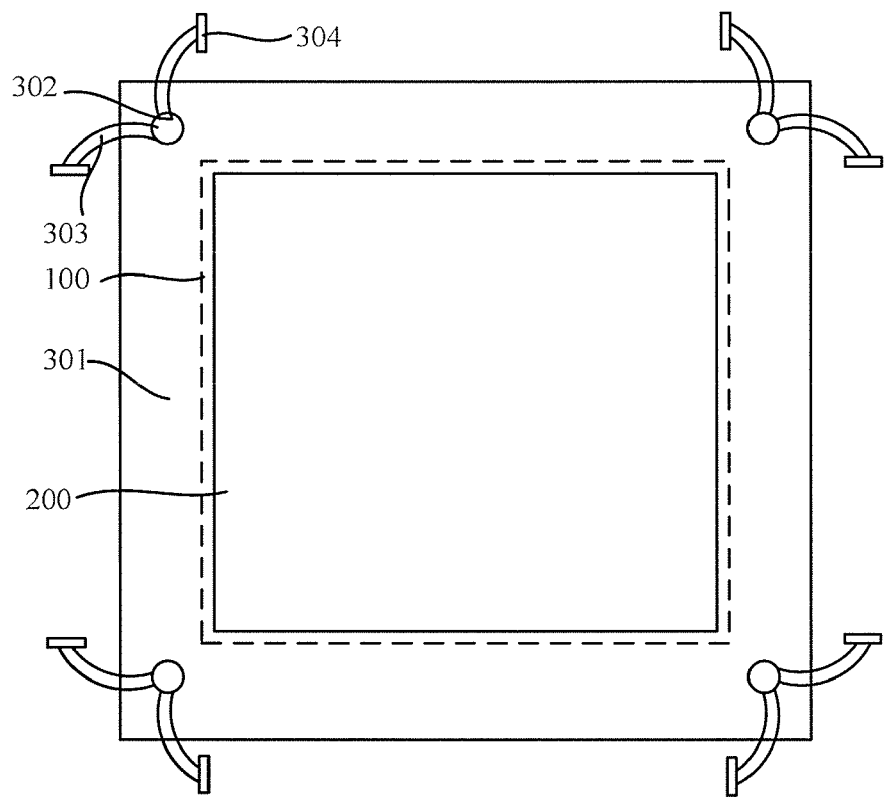
FIG. 10 is an illustrative view of a state of the second embodiment of the handling system according to the present invention, with the rotational arm in an open position.

The operation of the embodiment of the handling system is described below. The cassette 100 carrying the glass plates 200 are moved away from the handling desk 300, the stop bar 112 drops until the stop block 113 bears against the upper surface of the stop projection 111 so that the lower end of the stop bar 112 extends beyond a plane of the lower surface of the cassette, and the securing device 110 moves due to the drop of the stop bar 302 to clamp the glass plates 200 in the cassette 100. The control means is driven to rotate the rotation arms 303 to an open position as shown in FIG. 10, in which the rotation arms 303 are opened to receive the cassette 100 in the region defined by the positioning levers 302, and then the cassette 100 is placed on the base platform in the region with the vertical edges each being positioned adjacent to the respective positioning lever 302. At that time, the lower end of the stop bar 112 moves upward until flushing with the plane of the base plate of the cassette 100, and the upward movement of the stop bar 112 leads to the movement of the securing portion 116 of the securing device 110 so as to release the glass plates 200. As shown in the FIG. 9, the rotational arms 303 are rotated to a close position for clamping the glass plates 200 under the control of the control means. When a glass plate is needed, the rotational arms 303 are driven to the open position for unloading of the glass plate.

In the embodiment, there are four positioning levers, but there may be two positioning levers arranged in positions adjacent to two opposite vertical edges respectively, that is, at two corners diagonally. The rotational arms on the two positioning lever can rotates and clamp the glass plates therebetween so as to adjust the position of the glass plates.

The handling system of the embodiment can prevent the position offset of the glass plates actively during transportation with the securing device of the cassette, and can further adjust the position of the glass plates through the rotational arms on the handling desk. The position of the glass plates depends on the rotational position of the rotational arms, whose rotational angle and velocity and rotation procedure of the rotational arms may be controlled by the control means such as a PLC or an industrial computer. The positioning levers of the handling desk may be provided with a pair of the rotational arms for each glass plate, so that four corners of the glass plate can be clamped by the rotational arms. Shape and amount of the rotational arms may be determined as necessary as long as the rotational arms can cooperate with each other so as to clamp and rotate the glass plates. The handling desk of the handling system in the present embodiment has a relative big adjustment range, thus industrial accidents due to the limited adjustment of the position adjustment means in the processing can be avoided. Also, this further eliminates the risk of industrial accidents due to the position offset of the glass plates and increases working efficiency and product quality.

The embodiment of the invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A cassette comprising a top plate, a base plate, a plurality of posts arranged between the top plate and the base plate and defining an operation space, a securing device comprising a stop mechanism and a clamping mechanism and arranged along with one post, wherein the stop mechanism comprises:
    a stop projection provided on an outer side of the one of posts;
    a stop bar parallel to the one post and slidably disposed through the stop projection; and
    a stop block disposed on a side of the stop bar, wherein a lower end of the stop bar extends beyond a plane of the base plate when the stop block is bearing against an upper surface of the stop projection, and
    the clamping mechanism comprises:
    a first connection part with a rotation shaft in a middle portion of the first connection part being fixed to the one post and with one end connected with the stop bar in a transmission way; and
    a securing portion, which connects with the other end of the first connection part and is driven by the first connection part to move horizontally with respect to the one post when an up-and-down movement of the stop bar leads to rotation of the first connection part,
        wherein the one end of the first connection part connects with the stop bar via a second connection part,
        the second connection part connects with the stop bar and the first connection part with a first and a second hinges, respectively,
        the securing portion connects with the other end of the first connection part with a third hinge; and
        the rotation shaft and shafts of the first, second and third hinges are parallel with each other.

2. The cassette according to claim 1, wherein a spring is connected between the one post and the stop bar and is used to urging the stop bar downwardly until the stop block bears against the upper surface of the stop projection.

3. The cassette according to claim 2, wherein a first spring positioning pillar is disposed on a side of the post, and a second spring positioning pillar is disposed on a side of the stop bar and above the first spring positioning pillar, and
    wherein two ends of the spring are attached to the first spring positioning pillar and the second spring positioning pillar, respectively.

4. The cassette according to claim 1, wherein at least two clamping mechanisms are attached to the one post, and the clamping mechanisms comprise the same stop bar.

5. The cassette according to claim 4, wherein the securing portions of the clamping mechanisms are integral.

6. The cassette according to claim 4, wherein the securing portions of the clamping mechanisms are independently provided with each other.

7. The cassette according to claim 6, wherein the first connection parts of the clamping mechanisms have different lengths.

8. The cassette according to claim 1, wherein a first elastic pad is provided on an inner side of the securing portion facing the inside of the cassette.

9. A handling system comprising a cassette and a handling desk for supporting the cassette thereon, wherein the cassette comprises:
    a top plate, a base plate, a plurality of posts arranged between the top plate and the base plate and defining an operation space, a securing device comprising a stop mechanism and a clamping mechanism and arranged along with one post, wherein the stop mechanism comprises:

a stop projection provided on an outer side of the one of posts;

a stop bar parallel to the one post and slidably disposed through the stop projection;

a stop block disposed on a side of the stop bar, wherein a lower end of the stop bar extends beyond a plane of the base plate when the stop block is bearing against an upper surface of the stop projection, and the clamping mechanism comprises:

a first connection part with a rotation shaft in a middle portion of the first connection part being fixed to the one post and with one end connected with the stop bar in a transmission way; and a securing portion, which connects with the other end of the first connection part and is driven by the first connection part to move horizontally with respect to the one post when an up-and-down movement of the stop bar leads to rotation of the first connection part, wherein the one end of the first connection part connects with the stop bar via a second connection part, the second connection part connects with the stop bar and the first connection part with a first and a second hinges, respectively, the securing portion connects which the other end of the first connection part with a third hinge; and the rotation shaft and shafts of the first, second and third hinges are parallel with each other.

10. The handling system according to claim 9, wherein the handling desk comprises:

a base platform;

at least two positioning levers vertically arranged on the base platform for defining a region on the base platform to support the cassette thereon; and a pair of rotational arms provided on one positioning lever and capable of rotating about the one positioning lever so that ends of the pair of the rotational arms cooperate with each other so as to clamp a glass plate placed in the cassette.

11. The handling system according to claim 10, wherein a second spring pad is provided on an end of each of the rotational arms.

12. The handling system according to claim 10, wherein the rotational arms are arcuate levers and the pair of rotational arms are oppositely arranged so as to cooperate with each other.

13. The handling system according to claim 9, wherein a spring is connected between the one post and the stop bar and is used to urging the stop bar downwardly until the stop block bears against the upper surface of the stop projection.

14. The handling system according to claim 9, wherein at least two clamping mechanisms are attached to the one post, and the clamping mechanisms comprise the same stop bar.

15. The handling system according to claim 14, wherein the securing portions of the clamping mechanisms are integral.

16. The handling system according to claim 14, wherein the securing portions of the clamping mechanisms are independently provided with each other.

17. The handling system according to claim 16, wherein the first connection parts of the clamping mechanisms have different lengths.

18. The handling system according to claim 9, wherein a first elastic pad is provided on an inner side of the securing portion facing the inside of the cassette.

* * * * *